United States Patent
Retersdorf

(10) Patent No.: US 7,657,339 B1
(45) Date of Patent: Feb. 2, 2010

(54) PRODUCT-RELATED FEEDBACK FOR PROCESS CONTROL

(75) Inventor: Michael A. Retersdorf, Austin, TX (US)

(73) Assignee: GlobalFoundries, Inc., Grand Cayman (KY)

( * ) Notice: Subject to any disclaimer, the term of this patent is extended or adjusted under 35 U.S.C. 154(b) by 490 days.

(21) Appl. No.: 11/251,604

(22) Filed: Oct. 14, 2005

(51) Int. Cl.
*G06F 19/00* (2006.01)

(52) U.S. Cl. .................... 700/121; 700/108

(58) Field of Classification Search ............. 700/44, 700/45, 108, 109, 110, 121
See application file for complete search history.

(56) References Cited

U.S. PATENT DOCUMENTS

| | | | |
|---|---|---|---|
| 4,796,194 A | 1/1989 | Atherton | |
| 5,210,041 A | 5/1993 | Kobayashi et al. | |
| 5,319,570 A * | 6/1994 | Davidson et al. ............ | 716/4 |
| 5,721,686 A | 2/1998 | Shahraray | |
| 5,787,021 A | 7/1998 | Samaha | |
| 6,174,738 B1 | 1/2001 | Steffan et al. | |
| 6,580,960 B1 | 6/2003 | Nicholson | |
| 6,694,492 B1 | 2/2004 | Shakkarwar | |
| 7,401,066 B2 * | 7/2008 | Beinglass et al. ............ | 707/2 |
| 2003/0182252 A1 | 9/2003 | Beinglass et al. | |

FOREIGN PATENT DOCUMENTS

| | | |
|---|---|---|
| WO | 02/47150 A2 | 6/2002 |
| WO | 02/47150 A3 | 6/2002 |

OTHER PUBLICATIONS

PCT International Search Report, Apr. 13, 2007.
Official Communication issued May 18, 2009 (Translation); 5 pages.

* cited by examiner

*Primary Examiner*—Ryan A Jarrett
(74) *Attorney, Agent, or Firm*—Williams, Morgan & Amerson, P.C.

(57) ABSTRACT

A method, apparatus, and a system for performing a product feedback for process control are provided. Metrology data relating to a first workpiece is received. An end of line parameter relating to the first workpiece is received. The end of line parameter is correlated with the metrology data. A process control associated with a plurality of processes to be performed on a second workpiece is adjusted based upon the correlating.

10 Claims, 7 Drawing Sheets

PRODUCT-RELATED FEEDBACK FOR PROCESS CONTROL

BACKGROUND OF THE INVENTION

1. Field of the Invention

This invention relates generally to semiconductor manufacturing, and, more particularly, to a method and apparatus for providing feedback for process control using an end of line (EOL) related parameter.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally finetuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using a patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on single or multiple die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a flowchart depiction of an illustrative prior art process flow is depicted. A manufacturing system may determine a type of product that is to be manufactured by processing semiconductor wafers 105 (block 210). This leads to a step of determining process control parameters for processing a batch of semiconductor wafers 105. A predetermined plan for processing wafers to achieve a certain type of process result is determined. Based upon the processing plan, the manufacturing system directs various factory components to perform a series of processes upon a batch of semiconductor wafers 105 (block 220). A number of control parameters for controlling the processing of wafers are predetermined and implemented. This may include predetermined scheduling, routing, and tool control parameters to control the operations of various components of a factory or a fab.

At various points throughout the processing of the wafers, metrology data and/or tool state data may be acquired (block 230). The metrology data and/or the tool state data may be used to perform various feedback adjustments to a subsequent process step (block 240). The feedback data and/or the tool state data may be used to compensate for any detected process errors by adjusting a subsequent process. These feedback adjustments may be performed at various points in the processing stream wherein generally, feedback data is used to adjust a particular subsequent process step.

Included among the problems associated with the current metrology is the fact that various external (relative to the manufacturing area) or internal changes may cause the predetermined processing plans to become inefficient or outdated. Quite often, changes in the external factors (e.g. business factors that are not directly associated with controlling the process operations in the fab) may prompt the manufacturing system to place priority on wafers that no longer merit process priority. For example, the market climate may change after an initial assessment had indicated a demand for a particular type of product (e.g., very high speed processors), prompting demand for a second type of processor. This may make the initial processing plan less efficient.

Additionally, unexpected characteristics relating to a product manufactured by performing a series of process steps on a wafer, may call for modifications of the processes performed on other wafers. However, the requisite information required for such modifications may not be readily available until a large number of wafers have been processed. The state-of-the-art lacks an efficient methodology of anticipating potential process results and implementing modifications to a series of processes in order to preempt possible end of line deficiencies in product performance.

Furthermore, internal changes, such as changes to the operation of various processing tools, metrology tools, etc., may also cause the predetermined plan to be less than optimal. In state-of-the-art systems, changes in the factory components or external factors may not be dealt with efficiently due to the predetermined process plan that is generally used to control the process operations. Generally, a commitment to produce a particular type of process result (i.e., a particular type of integrated circuit (IC) chip) is made sometimes months in advance. These predetermined plans are then employed by through the manufacturing system. Meanwhile, various internal or external changes may occur, which may cause the predetermined plans to be no longer optimum. These changes may include changes in the market demands and/or other market forces, changes in process conditions within the factory or fab, and/or changes in the business goals of the entity performing the processes. Despite these changes, the predetermined plan is generally already implemented into processing operations and therefore, leads to a lack of flexibility in processing operations.

Designers have attempted to alleviate some of these problems by providing feedback based upon product output. However, this method does not address all of the problems described above, including changes in the business plan and/or internal factors. As an example, state-of-the-art systems generally call for adjusting the same process, or the next process, based upon the reception of a process feedback signal that is received from a downstream process. This adjustment may not be enough to address all of the issues relating to end-of-line product data. Additionally, various external factors, such as market changes and business goals may not be efficiently addressed by such state-of-the-art systems. This could lead to inefficient reaction to various internal or external factors, leading to a loss of reaction time to a business factor and/or lack of flexibility in adjusting for internal manufacturing problems.

The present invention is directed to overcoming, or at least reducing, the effects of one or more of the problems set forth above.

SUMMARY OF THE INVENTION

In one aspect of the present invention, a method is provided performing a product feedback for process control. Metrology data relating to a first workpiece is received. An end of line parameter relating to the first workpiece is received. The end of line parameter is correlated with the metrology data. A process control associated with a plurality of processes to be performed on a second workpiece is adjusted based upon the correlating.

In another aspect of the present invention, a method is provided for performing a product feedback for process control. A first process is performed upon a first workpiece. Metrology data relating to the first process of the workpiece is received. An end-of-line parameter relating to the first workpiece is received. The end-of-line parameter to the metrology data is correlated. An end-of-line parameter relating to a second workpiece is modeled. The modeling of the end-of-line parameter is based upon the correlation of the end-of-line parameter with the metrology data. The first process and a second process to be performed upon a second workpiece are adjusted based upon the modeling of the end-of-line parameter.

In another aspect of the present invention, a method is provided for performing a product feedback for process control. Metrology data relating to a workpiece is received. Data relating to a predicted end of line parameter relating to the workpiece is received. The predicted end of line parameter is correlated with the metrology data. A plurality of remaining processes to be performed upon the workpiece is adjusted based upon the correlating.

In another aspect of the present invention, a method is provided for performing a product feedback for process control. Metrology data relating to a workpiece is received. Data relating to a predicted end of line parameter relating to a workpiece is received. Data relating to an external factor relating to processing of the workpiece is received. Data relating to an internal factor relating to processing of the workpiece is received. The predicted end of line parameter is correlated with the metrology data, the external factor, or the internal factor. A plurality of remaining processes to be performed upon the workpiece is adjusted based upon the correlating.

In another aspect of the present invention, a system is provided for performing a product feedback for process control. The system of the present invention includes a workpiece and a first controller. The first controller is adapted to correlate an end of line parameter relating to the workpiece with metrology data relating to the workpiece, and provide feedback data for adjusting a plurality of process steps. The system also includes a second controller to perform the adjusting of the process steps. The system also includes a processing tool operatively coupled with the second controller. The processing tool is capable of processing the workpiece.

In yet another aspect of the present invention, a computer readable program storage device encoded with instructions is provided for performing a product feedback for process control. The computer readable program storage device encoded with instructions that, when executed by a computer, performs a method, comprising: receiving metrology data relating to a first workpiece; receiving an end of line parameter relating to the first workpiece; correlating the end of line parameter with the metrology data; and adjusting a process control associated with a plurality of processes to be performed on a second workpiece based upon the correlating.

BRIEF DESCRIPTION OF THE DRAWINGS

The invention may be understood by reference to the following description taken in conjunction with the accompanying drawings, in which like reference numerals identify like elements, and in which.

Figure 1:
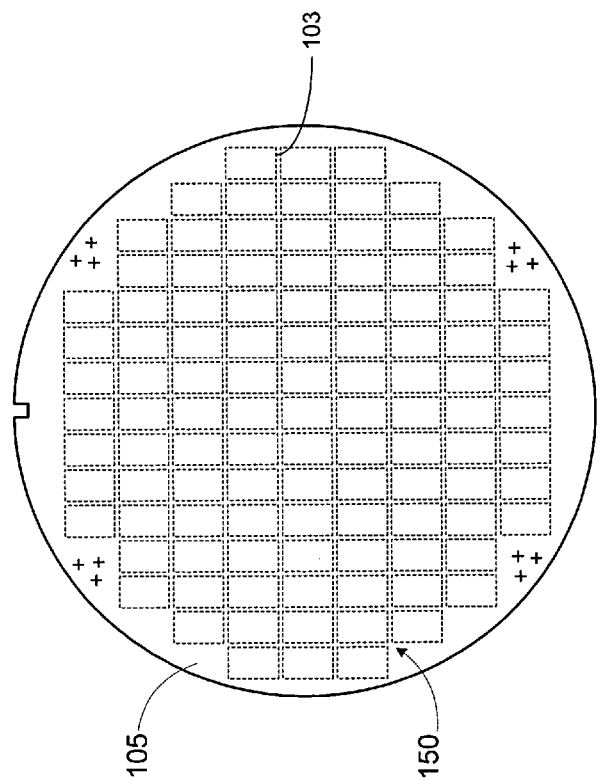
FIG. 1 illustrates a stylized depiction of a semiconductor wafer that may be processed by a semiconductor manufacturing system.
Figure 2:
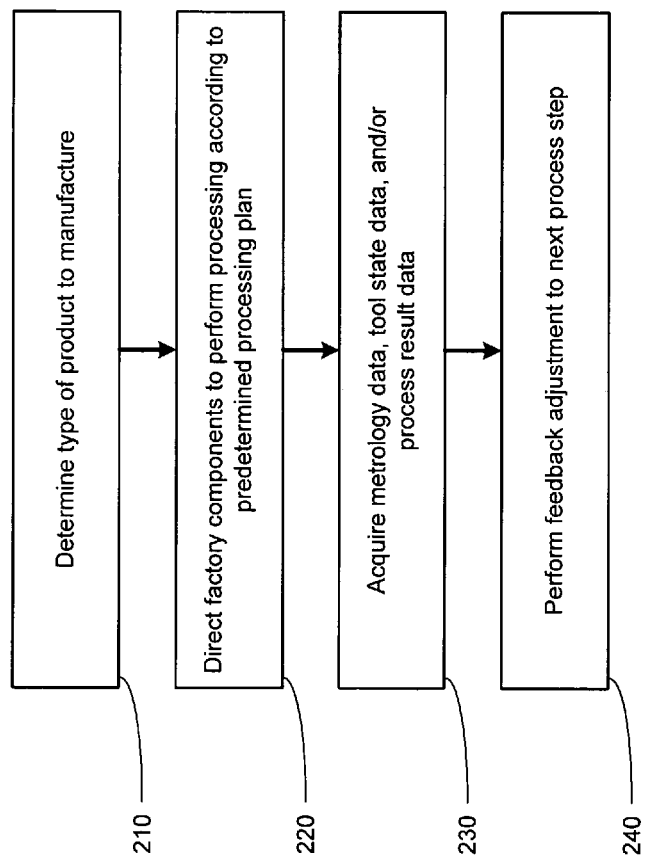
FIG. 2 illustrates a flowchart depiction of a prior art method for processing semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

The present invention will now be described with reference to the attached figures. Various structures, computers, process tools, and systems are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

There are many discrete processes that are involved in semiconductor manufacturing. Workpieces (e.g., semiconductor wafers 105, semiconductor devices, etc.) are typically stepped through multiple manufacturing process tools. Embodiments of the present invention provide for performing a feedback correction of a plurality of process steps in a process chain based upon various internal and/or external factors. Various end-of-line performance characteristics may be analyzed in order to perform the feedback provided by embodiments of the present invention. Additionally, one or more end-of-line (EOL) parameter(s) may be predicted or modeled. The modeled EOL parameter(s) may be used to perform inline tool adjustments and/or process corrections.

Embodiments of the present invention also provide for a correlation of product test results versus inline tool and/or process conditions or measurements. This correlation may be used to perform modeling of an EOL parameter. Additionally, various external factors or other internal factors may be considered in determining the nature of feedback adjustments. The feedback adjustment process provided by embodiments of the present invention may call for adjusting a plurality of process steps in a process chain. A model may be created to correlate manufacturing data with various actual or predicted EOL parameters, external factors, and/or internal factors. This correlation may then be used to control a plurality of processes relating to a processing plan for producing various semiconductor products. This provides for a "long" feedback loop that may encompass feedback control of a plurality of process steps.

Figure 3:
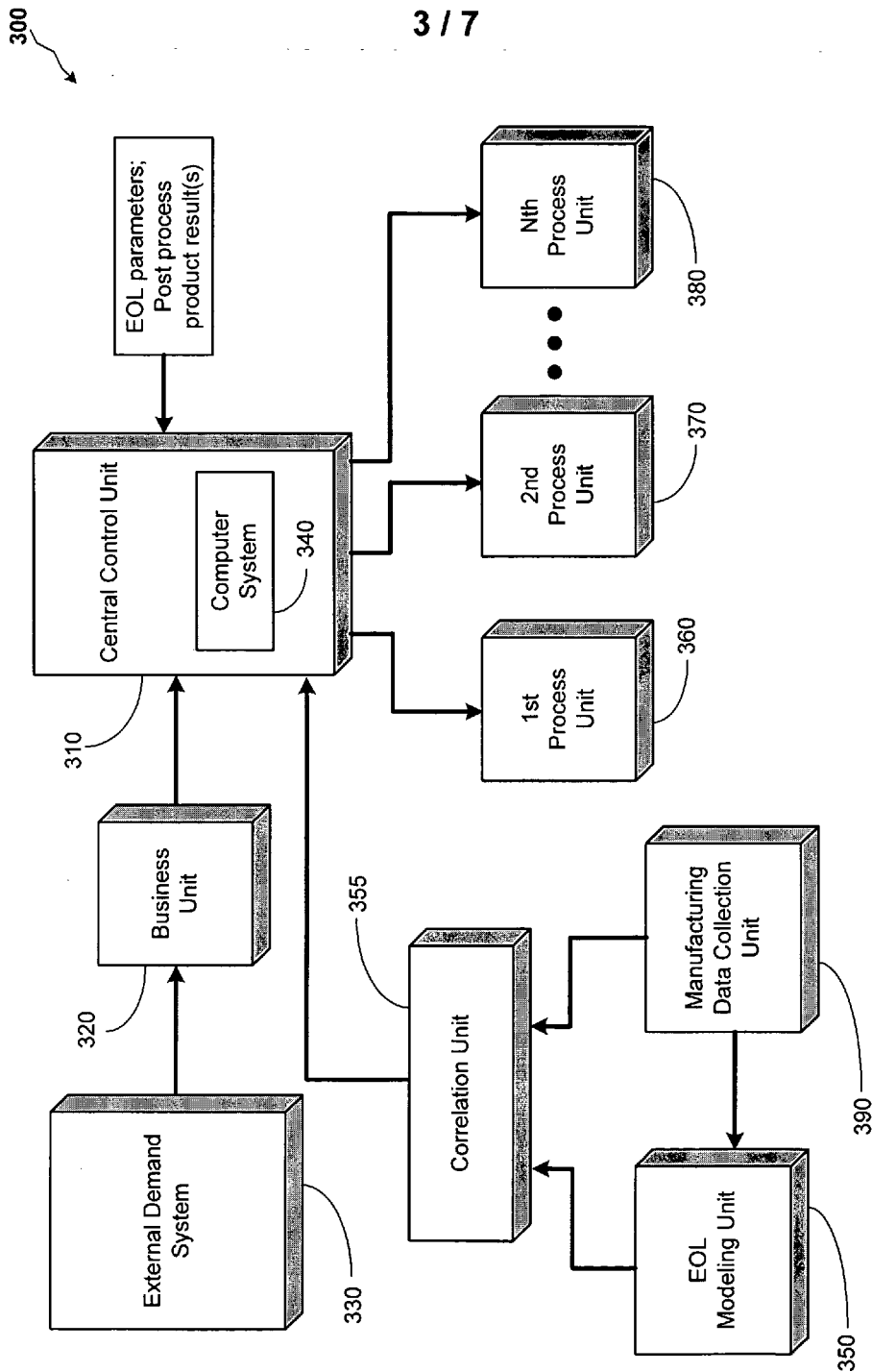
FIG. 3 illustrates a block diagram of a system depicting a central control unit for controlling a plurality of factory components, in accordance with one illustrative embodiment of the present invention.

Turning now to FIG. 3, a block diagram depiction of a system in accordance with an illustrative embodiment of the present invention is provided. The system 300 comprises a central control unit 310 that is capable of overseeing and affecting the respective operations of a plurality of process control segments in a factory/fab. For example, a factory may comprise various processing tools that are controlled by one or more tool controllers that may be part of a process control unit.

The central control unit 310 is capable of receiving data and/or instructions from external sources (i.e., sources external to a factory/fab), as well as from internal sources (i.e., sources internal to a factory/fab), to affect the operation of various components of a factory. External sources may include various departments of a business entity that is substantially outside of the manufacturing or processing area, e.g., the marketing department, sales department, etc. External sources may also include market data, trends, demands, etc. Internal sources may include various components substantially within a manufacturing or processing environment, e.g., a local process controller, a processing tool, a metrology tool, tool state sensors, etc.

The central control unit 310 is capable of receiving EOL information relating to a substantially completed product produced by the manufacturing facility. The central control unit 310 may also receive information relating to modeling a prediction of EOL parameters. Various EOL parameters or other post-process product results may be fed back to the central control unit 310 for performing feedback corrections. The central control unit 310 may also comprise a computer system 340 that is capable of performing various tasks, such as calculating modifications of parameters and generating control parameters or actions in response to various external and/or internal data. These control parameters or actions may then be used to direct the operation of various components of the factory/fab.

The system 300 may also comprise an external demand system 330 that may provide various decision-making instructions and/or data relating to various external factors. In one embodiment, the external demand system 330 may refer to a number of entities, such as databases, software units, business organizations, etc, that are capable of providing data relating to marketing decisions, product demand, pricing data, market trends, etc. As an example, the external demand system 330 may provide data that reveals a large emphasis upon the manufacturing of a particular product that may be instrumental in expanding into a new market. For example, a new type of processor may involve lower yields, longer processing cycle times, etc., but may provide a company with an opportunity to enter a new, emerging market. This consideration may drive the operation of processing of wafers in a different direction as compared to previous operations that were less reactive to market data.

The system 300 may also include a business unit 320, which may be a software unit, a computer system, and/or the like. The business unit 320 may receive various external market-data from the external system 330. Based upon data from the external demand system 330, the business unit 320 may provide the central control unit 310 with data and/or instructions relating to processing semiconductor wafers 105. The business unit 320, for example, may consider various business-related aspects such as market demand, price of completed product, yield, cycle time, and/or risk factors in proceeding with a particular type of processing, etc. The business unit 320 may also consider various other business-related considerations relating to processing semiconductor wafers 105 that are known to those skilled in the art having benefit of the present disclosure. Based upon these considerations, the business unit 320 may provide one or more business-related, external factor(s) that may be considered by the central control unit 310 for performing the long feedback process provided by embodiments of the present invention.

The system 300 may also comprise a first process unit 360, a second process unit 370 through an $N^{th}$ process unit 380. The $1^{st}$ through $N^{th}$ process units 360-380 may comprise one or more processing tools, a process controller, and/or other elements for performing wafer processing. A more detailed description of the $1^{st}$ through $N^{th}$ process units 360-380 is provided in FIG. 4 and accompanying description below.

Referring back to FIG. 3, the system 300 may also comprise an EOL modeling unit 350. The EOL modeling unit 350 is capable of modeling various parameters relating to a product that may result from the completion of a series of process steps performed on wafers. The EOL modeling unit 350 may consider various internal and/or external factors when modeling a potential EOL parameter. Examples of internal factors may various factors that are internal to a manufacturing environment. These internal factors may include, but are not limited to, a tool availability parameter, a tool condition parameter, a potential yield parameter, a cycle time parameter, a process risk parameter, and a process volume parameter. Examples of external factors may various factors that are external to a manufacturing environment. These external factors may include, but are not limited to, a market demand, a price of a completed product, yield resulting from processing the wafers, cycle time, and risk factors in processing the wafers.

Further, the EOL modeling unit 350 may also consider actual product output results in order to model EOL parameters. For example, the EOL modeling unit 350 may correlate or combine product result data or actual EOL parameter data, with metrology and/or tool state data to generate a predicted EOL parameter. This correlation may involve taking into consideration an EOL parameter relating to a particular wafer that was processed by the system 300. Metrology data and/or tool state data relating to the particular wafer may then be correlated with the actual EOL parameter to model future, potential EOL parameters. Feedback adjustments may be performed based upon the modeling of EOL parameters. The term "EOL parameters" may refer to a variety of product results including sort yield results that include die-level operation characteristics (e.g., speed, power consumption, etc). The term "EOL parameters" may also refer to class yield results that include operation characteristics of packaged die that are formed into electronic products (e.g., speed, power consumption, burn-in test results, etc., relating to semiconductor devices).

Additionally, the system 300 may also comprise a manufacturing data collection unit 390. The manufacturing data collection unit 390 may be capable of acquiring metrology data, and/or tool state data relating to various process steps performed by the $1^{st}$ through $N^{th}$ process units 360-380. The collection unit 390 may also store various EOL parameters. The metrology data collection unit 390 may comprise memory storage to store various metrology and/or tool state data. The tool state data may include, but is not limited to, pressure data, gas flow data, temperature of the chamber of a processing tool, etc.

The system 300 may also comprise a correlation unit 355 that is capable of correlating various external and/or internal data to provide the central control unit 310 with information relating to various feedback possibilities. The correlation unit 355 may receive data from the EOL modeling unit 350, the manufacturing data collection unit 390, and/or the business unit 320. The correlation unit 355 is capable of correlating particular metrology data, tool state data, EOL prediction data and/or actual EOL parameter data.

Furthermore the correlation unit 355 is also capable of correlating EOL product results to metrology data and/or tool state data relating to the processes performed on the wafers from which the EOL product results were acquired. Based upon this correlation, various EOL parameters relating to wafer to be subsequently processed, may be modeled. Data from the correlation unit 355 may provide the central control unit 310 with an indication of the type of internal process condition(s) that would lead to particular predicted or actual EOL product parameters.

Additionally, the correlation unit 355 may receive external data from the business unit 320 for correlating internal and external data. Using data from the correlation unit 355, the central control unit 310 is capable of performing feedback correction(s) to a predetermined process plan. This correction may include scheduling or routing adjustments, process control adjustments, etc. Such adjustments may be performed to adjust to new realities associated with the internal and/or external factors. Various components illustrated in the system 300, including the business unit 320, the correlation unit 355, the EOL modeling unit 350, the manufacturing data collection unit 390, etc., may comprise hardware, software, and/or firmware units, or may be comprised of any combination thereof.

Figure 4:
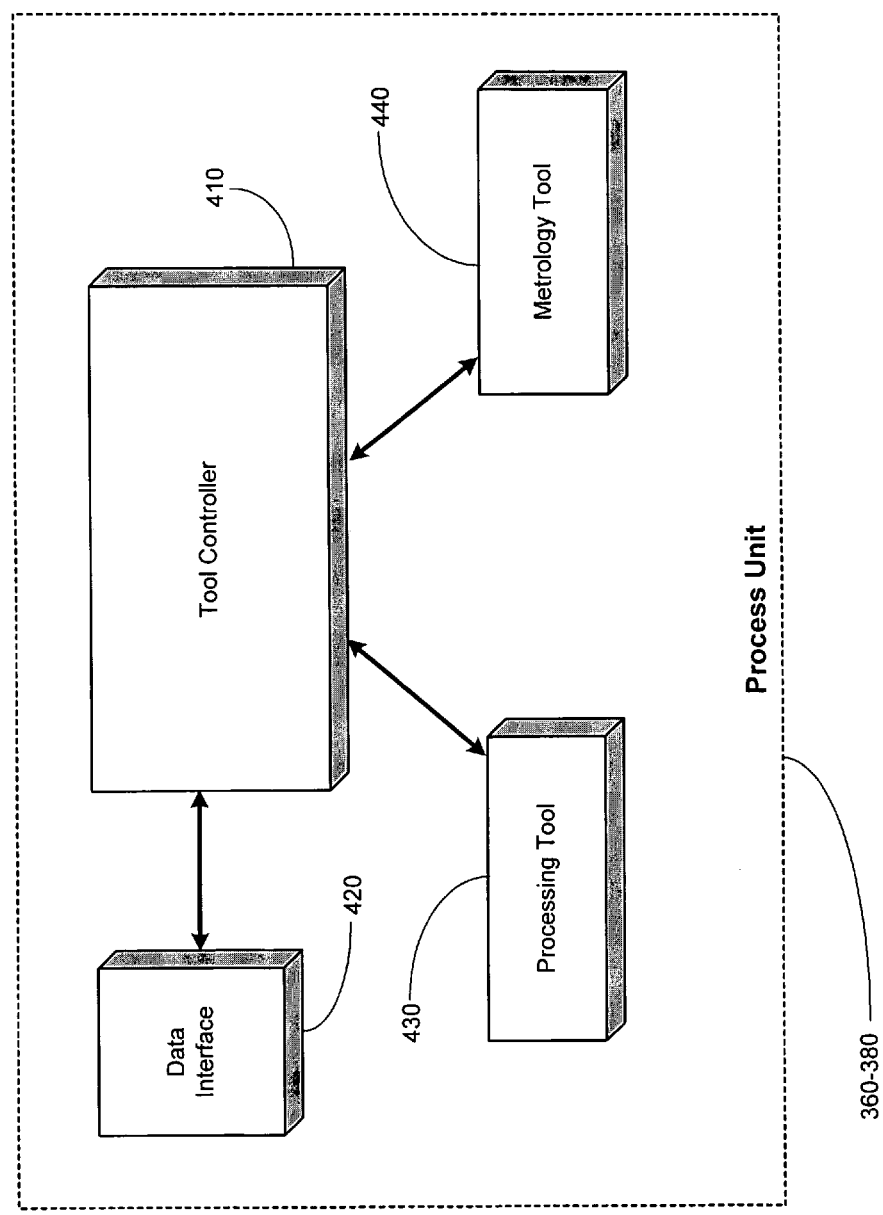
FIG. 4 illustrates a more detailed block diagram depiction of a process unit of FIG. 3, in accordance with one illustrative embodiment of the present invention.

Turning now to FIG. 4, a block diagram depiction of the process units 360-380, in accordance with one embodiment of the present invention, is illustrated. Each of the process units 360-380 may comprise a tool controller 410 that is capable of controlling the operation of a processing tool 430 and/or a metrology tool 440. The processing tool 430 may be an etch tool, a deposition tool, a chemical-mechanical polishing (CMP) tool, a photolithography tool, or any other tool capable of processing semiconductor wafers 105. The metrology tool 440 is capable of acquiring metrology data relating to a processed semiconductor wafer 105. The metrology tool 440 may be a stand-alone tool or it may be integrated with the processing tool 430 itself. A data interface 420 may receive data from, and/or send data to, the central control unit 310. The data received by the data interface 420 may be used to control various components of the process units 360-380, including directing the operation of the processing tool 430 and the metrology tool 440.

The tool controller 410 may receive data from the central control unit 310, which may provide feedback control information and/or lot-priority information relating to a particular lot or group of semiconductor wafers 105 that are to be processed. The feedback control information and/or lot-priority information relating to a lot of wafers may be based upon a plurality of internal and/or external factors. The feedback control information may include process adjustment data and/or tool adjustment data, as well as scheduling and/or routing data. Based upon the data from the central control unit 310, modification of prior scheduling or routing plans may be performed. In response to such modification, the tool controller 410 may perform an assessment of the availability of the processing tool 430 and/or the metrology tool 440. In an alternative embodiment, the tool controller 410 may reside outside the process units 360-380. In this embodiment, the tool controller 410 may direct the operation of various process units 360-380.

Figure 5:
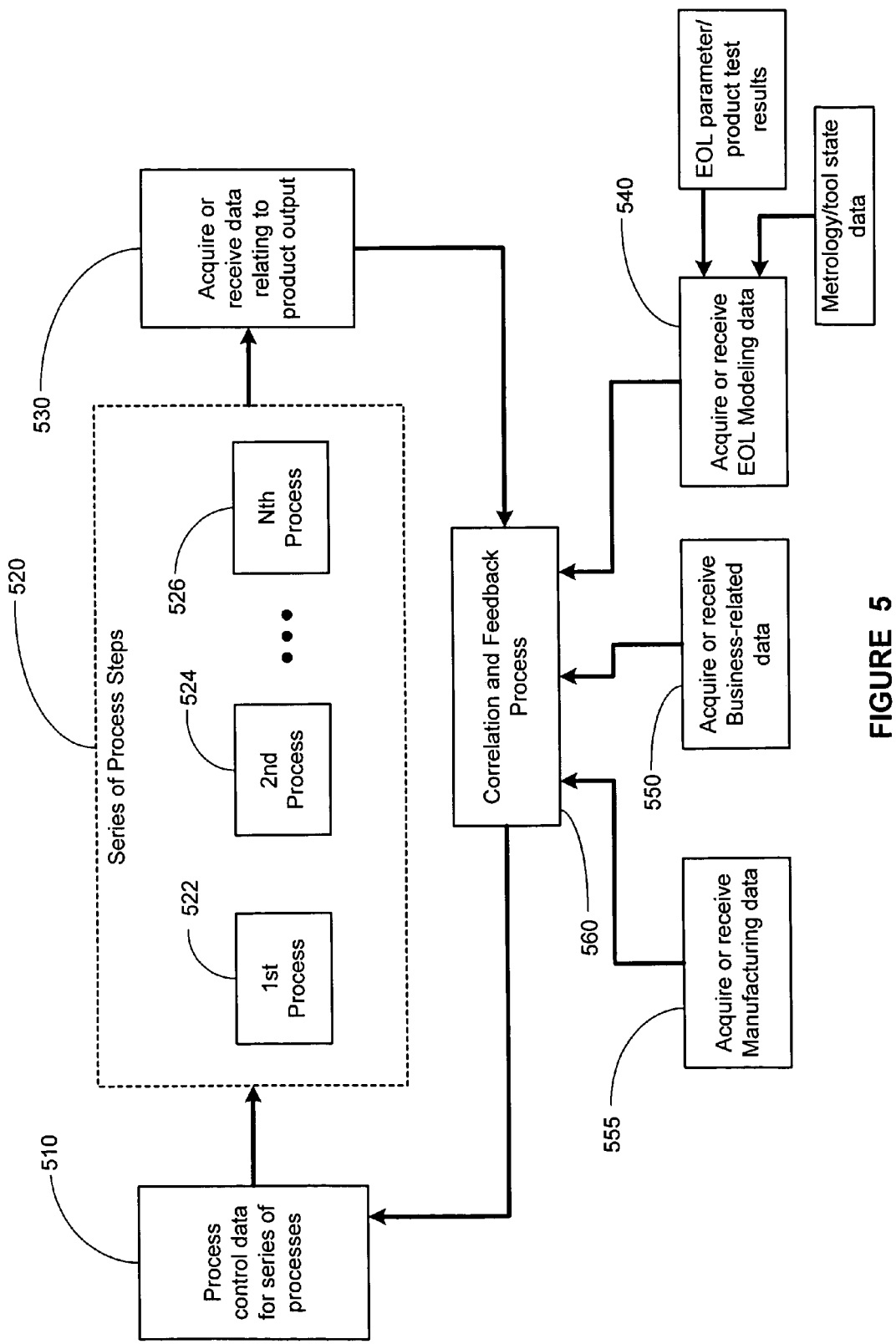
FIG. 5 illustrates a block diagram depiction of a feedback pack of the product feedback provided by the system of FIG. 3, in accordance with one illustrated embodiment of the present invention.

Turning now to FIG. 5, a block diagram depiction of a long feedback path, in accordance with an illustrative embodiment of the present invention is provided. Based upon the type of product to be manufactured, process control data relating to a series of process steps may be acquired by the system 300 (block 510). Based upon the process control data, a series of process steps may be performed by the system 300 (block 520). The series of process steps of block 520 may comprise a $1^{st}$ process 522, a $2^{nd}$ process 524 through an $N^{th}$ process 526. Based upon the performance of the $1^{st}$ through $N^{th}$ processes 522-526, a substantially completed product is provided. Based upon the series of process steps 520, the system 300 may acquire or receive data relating to the product output 530 (block 530). This data may relate to various end-of-line parameters of a product that resulted from the processing of the wafers through the series of process steps of block 520. These EOL parameters may comprise various indications of a product's performance, such as operating speed, access times, etc.

Additionally, even before the actual product output is available, the system 300 may receive EOL modeling data, as indicated by block 540. The EOL modeling data may relate to predicted end-of-line parameters that may be modeled at any point during the series of process steps of block 520. In one embodiment, the closer to the end process 526 the modeling of the EOL parameter, the better the value of the resulting predicted EOL parameters. In an alternative embodiment, product test results or actual EOL parameter data may be correlated or combined with metrology data and/or tool state data to perform the EOL modeling of block 520. In this embodiment, feedback corrections may be directly based upon the EOL modeling.

Further, the system 300 may acquire or receive business-related data, as provided by the business unit 320 described above (block 550). The feedback path of FIG. 5 may also include a correlation and feedback process (block 560). During the correlation and feedback process (560), various data may be considered, such as data relating to the product output, EOL modeling data, business related data, and/or the like. These data sets are correlated to provide feedback information to the system 300.

The correlation and feedback process 560 may receive manufacturing data, e.g., metrology and/or tool state data relating to processed wafers and/or processing tools that processed the wafers (block 555). The metrology and/or tool state data may be correlated to specific characteristics of structures (e.g., the dimensions of gate electrode structures) on the processed wafer. As an example, the feedback path illustrated by FIG. 5 may provide an indication of a particular type of speed of a product that may be based upon the measured dimensions of gate electrode structures. Therefore, the particular speed of a product provided by the data relating to a product output (530), or the modeled EOL prediction (540), may be correlated with the particular gate electrode measurement provided by the manufacturing data of block 555. This correlation may indicate that gate electrode structures having certain sizes of shapes lead to desirable product operation speed. Based upon this correlation, the correlation/feedback process 560 may provide data for adjusting a plurality of processes in the series of process steps of block 520 in order to obtain such gate electrode structures with such size and/or shape characteristics. As an example, the $1^{st}$ process 522 may be a photolithography process and the $2^{nd}$ process 524 may be an etch process. Both of these processes (522 and 524) may be adjusted to provide variations in the photolithography process and in the etch process. These variations may lead to the formation of gate electrode structures having the desired measurements that provide the desired speed of the product. The desired speed may relate to actual product output data or the predicted speed provided by modeling of the EOL. In a similarly fashion, various other EOL characteristics may be correlated to various manufacturing data, such as temperature of a chamber in a particular tool, or various critical dimension measurements on the processed wafers. Such a correlation may then be used to adjust the process control for the series of process steps of block 520.

The correlation and feedback process may include various algorithms that calculate and provide weight to various input factors that may be deemed more or less important, depending on the goals of the factory/fab. The correlation and feedback process of block 560 may result in data that may be used by the various process controllers to adjust process control parameters of one or more of the series of process steps of block 520. In other words, data from blocks 560 and 510 may be combined in order to control a series of process steps described by block 520. Accordingly, the feedback process illustrated in FIG. 5 provides for a long feedback process that is capable of adjusting a series of process steps based upon various internal and/or external factors.

Figure 6:
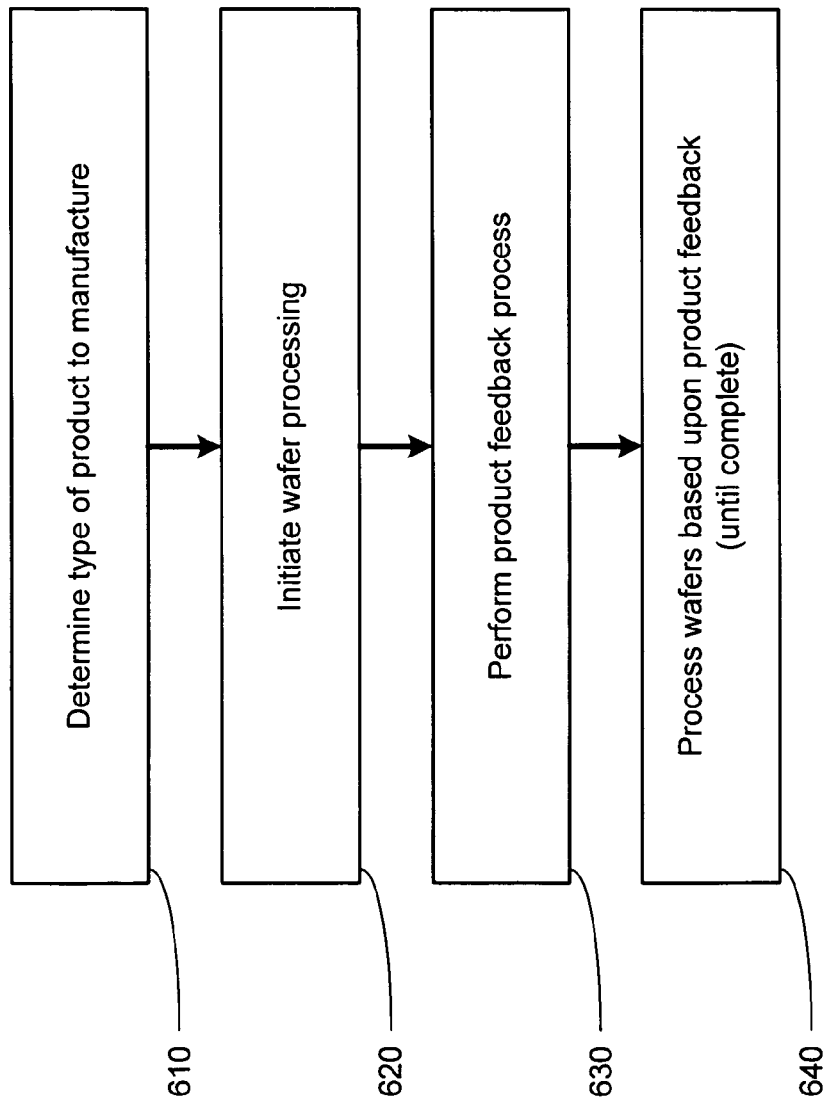
FIG. 6 illustrates a flowchart depiction of steps associated with a method in accordance with one illustrative embodiment of the present invention.

Turning now to FIG. 6, a flowchart depiction of the steps related to the method in accordance with an illustrative embodiment of the present invention is provided. The system 300 may make a determination relating to the type of product to be manufactured. These determinations may be influenced by external factors, such as a strong demand for a product that would be produced as a result of performing various processing steps upon a wafer. The market factors may comprise various external factors, such as market demands, prices, processing time, etc. The system 300 may also consider various factory conditions or internal conditions (e.g., availability of particular tools within the factory/fab, conditions of various processing tools, accuracy of the tools, and/or various other internal factors) to determine the type of product to be manufactured. Based upon the type of product to be manufactured, the processing of the semiconductor wafers may be initiated (block 620). This may include providing control data and/or a predetermined processing plan for performing a stream of process steps with the ultimate goal of producing a semiconductor product. The predetermined processing plan may include various scheduling data, routing information, control parameters to control various types of processing tools, etc.

Upon initiating the wafer processing series described in block 620, the system 300 may perform a product feedback process (block 630). This product feedback process may relate to acquiring actual data relating to a product output, or modeling/predicting EOL parameters at any point in the processing series. The actual or modeled EOL parameters may be used to perform adjustments to a series of process steps to obtain the desired product output result. A more detailed description of the product feedback process of block 630 is provided in FIG. 7 and accompanying description below. Upon execution of the product feedback process, a series of process steps may be adjusted based upon the product feedback data (block 640). This process may continue until all of the process steps for a particular batch of wafers are substantially completed. This feedback process may be a continuous process, wherein until all of the process steps in the process series are completed, the product feedback process may continue to adjust remaining process steps to be performed on the remaining wafers in a batch.

Figure 7:
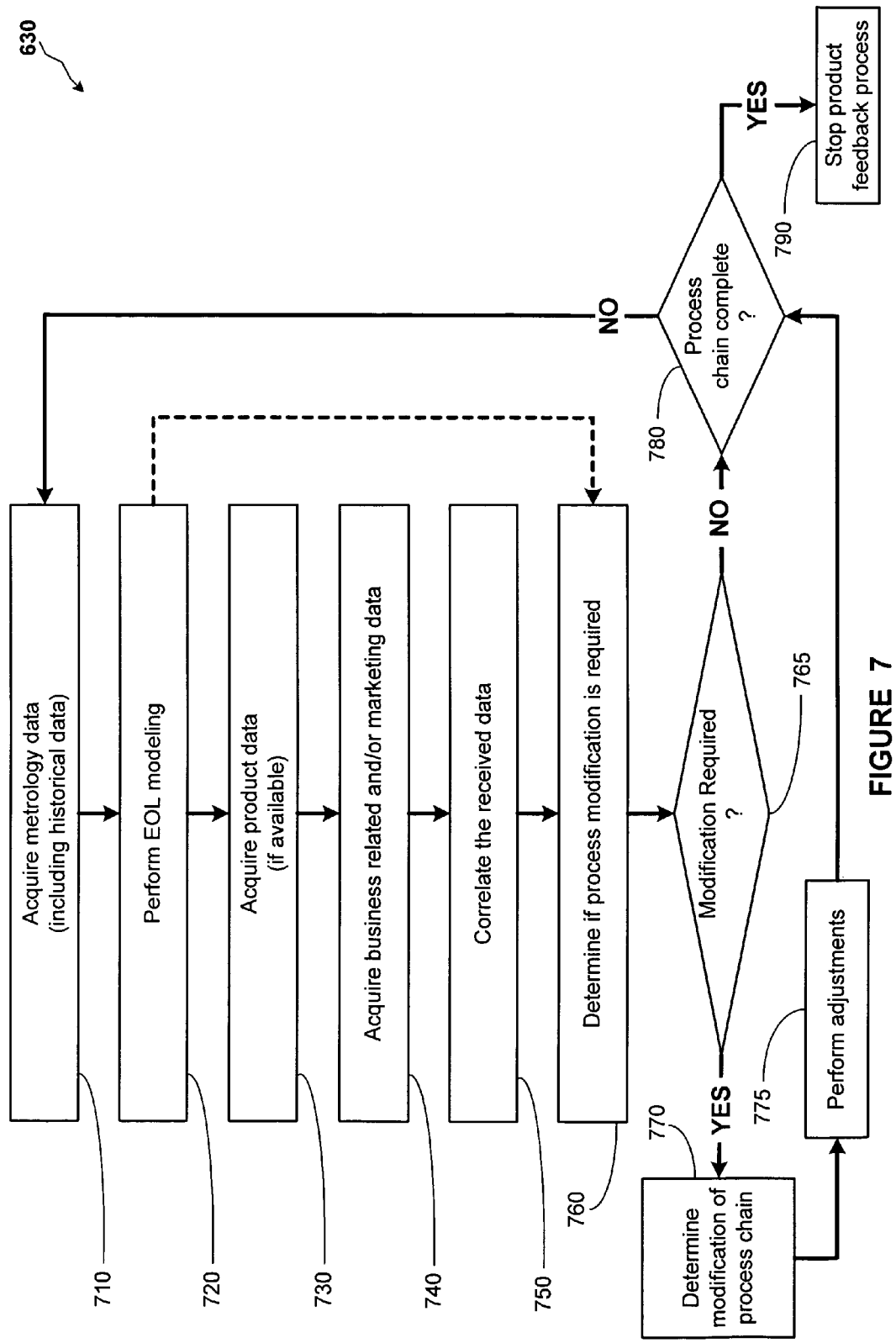
FIG. 7 illustrates a more detailed flow chart depiction of the step of performing a product feedback process described in FIG. 6, in accordance with an illustrated embodiment of the present invention.

Turning now to FIG. 7, a more detailed flowchart depiction of the product feedback process described in block 630 of FIG. 6, is illustrated. During the operation of the series of process steps for processing wafers, at any point in the process, acquisition of metrology data may be performed by the system 300 (block 710). The acquisition of the metrology data may include receiving or acquiring current data and/or stored, historical data. The system 300 may perform an EOL modeling at any given point of the series of process steps (block 720). This modeling may provide an indication of predicted EOL parameters that may be expected from a resultant product output upon completion of a series of process steps. The EOL modeling may be performed at virtually any given point during the operation of the $1^{st}$ through $N^{th}$ process units 360-380. In one embodiment, the step described in block 720 may entail correlating EOL parameter relating to a particular wafer with metrology data and/or tool state data relating to the processing of that particular wafer. This correlation may then be used to perform modeling of an EOL parameter. In an alternative embodiment, as indicated by the dotted line connecting block 720 to block 760, EOL modeling data may be used substantially singularly to perform feedback process modification (described in block 760-790 and accompanying description below).

The system 300 may also acquire product data, if available, from a product resulting from the completion of a series of process steps performed upon at least one wafer (block 730). Further, the system 300 may acquire business-related and/or marketing data relating to the product that would result from processing the wafers (block 740). For example, business-related data may indicate that a particular product with a different speed may now be more marketable. As a result of the business-related data, certain adjustments to a series of process steps (indicated in block 520 of FIG. 5) may be performed to adjust to the new realities of the business climate. The system 300 may correlate the EOL modeling data, the product data, the business-related data and/or the manufacturing data (block 750).

The correlation of the data described in block 750 may provide an indication of the relationship between the desired product, the actual product performance, and the predicted product performances. This correlation may then be used to determine if any process in the series of process steps is to be modified (block 760-765). Upon a determination as to whether the product modification is required, the system 300 determines how to modify one or more processes in the process chain (block 770). This may include a determination of which control parameter of a particular tool to adjust. For example, the adjustments may include the amount of time a certain etch process is performed, adjusting the temperature of a particular chamber of a processing tool, or any other adjustments that may be made to a process step.

If modification of a process is not required, as determined in block 765, then the process continues to block 780, where a determination is made whether the process chain or a series of process steps is complete. If a series of process steps have been completed, the feedback process is terminated (block 790). Referring back to block 770, upon a determination of how to modify the process chain or the series of process steps, the resultant information may be used to perform actual adjustments to a series of process steps (block 775). Upon performing these adjustments, a determination is made whether the process chain or the series of process steps are complete (block 780). If the process chain is complete, then the feedback process is terminated, as indicated in block 790. However, if the process chain is not yet complete, then the process may loop back to block 710, whereupon acquiring of various data described above is repeated.

Utilizing embodiments of the present invention, a more robust feedback process or a long feedback path, which encompasses adjustments of a plurality of processes, is provided. The feedback provides for adjusting a plurality of process steps based upon various factors. These factors may include data related to a completed product, data related to a predicted EOL parameter, business-related or other external data, and/or actual manufacturing data that include metrology or tool state data. These various data sets may be correlated such that an indication is provided as to what type of metrology and tool state data corresponds to certain type of product output. This information may then be used to provide a feedback correction of a series of process steps. Therefore, utilizing the embodiments of the present invention, a more robust and flexible processing plan is provided such that more efficient adjustments to new realities of, may be performed. Embodiments of the present invention provide for a more flexible processing chain to adjust and control the operation of a series of process steps.

The principles taught by the present invention can be implemented in an Advanced Process Control (APC) Framework, such as a Catalyst system formerly offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
   receiving metrology data relating to a first workpiece;
   receiving an end of line parameter relating to said first workpiece;
   acquiring data relating to at least one of a factor internal to a manufacturing environment or a factor external to a manufacturing environment;
   correlating said end of line (EOL) parameter with said metrology data and at least one of said factor internal to a manufacturing environment or said factor external to a manufacturing environment; and
   adjusting a process control associated with a plurality of processes to be performed on a second workpiece based upon said correlation of said EOL parameter with said metrology data and at least one of said factor external to a manufacturing environment, or said factor internal to a manufacturing environment;
   wherein acquiring data relating to said factor external to said manufacturing environment comprises acquiring at least one of a market demand, a price of completed product, a cycle time, and a risk factor in processing said first or second workpieces; and
   wherein acquiring data relating to said factor internal to said manufacturing environment comprises acquiring at least one of a tool availability parameter, a potential yield parameter, a cycle time parameter, a process risk parameter, or a process volume parameter.

2. The method of claim 1, wherein receiving metrology data relating to said first workpiece further comprises receiving metrology data relating to a semiconductor wafer.

3. The method of claim 1, further comprising processing a subsequent workpiece.

4. The method of claim 1, wherein receiving metrology data relating to said workpiece comprises measuring an end of line parameter from a product resulting from processing said first workpiece.

5. The method of claim 1, wherein receiving metrology data relating to said workpiece comprises modeling an end of line parameter relating to a product that would result from processing said first workpiece.

6. The method of claim 1, wherein adjusting a process control comprises adjusting a routing of said second workpiece.

7. A computer readable program storage device encoded with instructions that, when executed by a computer, performs a method, comprising:
   receiving metrology data relating to a first workpiece;
   receiving an end of line parameter relating to said first workpiece;
   acquiring data relating to at least one of a factor internal to a manufacturing environment or a factor external to a manufacturing environment;
   correlating said end of line (EOL) parameter with said metrology data and at least one of said factor internal to a manufacturing environment or said factor external to a manufacturing environment; and
   adjusting a process control associated with a plurality of processes to be performed on a second workpiece based upon said correlation of said EOL parameter with said metrology data and at least one of said factor external to a manufacturing environment, or said factor internal to a manufacturing environment;
   wherein acquiring data relating to said factor external to said manufacturing environment comprises acquiring at least one of a market demand, a price of completed product, a cycle time, and a risk factor in processing said first or second workpieces; and
   wherein acquiring data relating to said factor internal to said manufacturing environment comprises acquiring at least one of a tool availability parameter a potential yield parameter, a cycle time parameter, a process risk parameter, or a process volume parameter.

8. The computer readable program storage device encoded with instructions that, when executed by a computer, performs the method of claim 7, wherein receiving metrology data relating to said workpiece further comprises measuring an end of line parameter from a product resulting from processing said first workpiece.

9. The computer readable program storage device encoded with instructions that, when executed by a computer, performs the method of claim 7, wherein receiving metrology data relating to said workpiece further comprises modeling an end of line parameter relating to a product that would result from processing said first workpiece.

10. The method of claim 7, further comprising processing a subsequent workpiece.

* * * * *